(12) United States Patent
Clement

(10) Patent No.: US 9,716,394 B1
(45) Date of Patent: Jul. 25, 2017

(54) LIGHTING CONTROL DEVICE WITH REMOVABLE POWER SUPPLY CHARGE STATE INDICATION AND A METHOD THEREFOR

(71) Applicant: ABL IP Holding LLC, Conyers, GA (US)

(72) Inventor: Matthew A. Clement, Loganville, GA (US)

(73) Assignee: ABL IP HOLDING LLC, Conyers, GA (US)

(*) Notice: Subject to any disclaimer, the term of this patent is extended or adjusted under 35 U.S.C. 154(b) by 0 days.

(21) Appl. No.: 15/207,651

(22) Filed: Jul. 12, 2016

(51) Int. Cl.
*H02J 7/00* (2006.01)
*G01R 31/36* (2006.01)
*G06F 1/32* (2006.01)
*H05B 37/02* (2006.01)
*H03K 21/18* (2006.01)

(52) U.S. Cl.
CPC .......... *H02J 7/0047* (2013.01); *G01R 31/362* (2013.01); *G01R 31/3624* (2013.01); *G01R 31/3637* (2013.01); *G01R 31/3686* (2013.01); *G01R 31/3689* (2013.01); *G06F 1/3212* (2013.01); *H03K 21/18* (2013.01); *H05B 37/0272* (2013.01); *H02J 2007/005* (2013.01); *Y02B 60/1292* (2013.01)

(58) Field of Classification Search
CPC ............ H05B 37/0272; H05B 33/0842; H05B 37/0281; H05B 37/0218; G01R 31/3606; G01R 31/3686; G01R 31/3689; G01R 31/362; G01R 31/3624; G01R 31/3637; G01R 31/3648; G01R 31/3679; G01R 31/3693; H02J 7/0052; H02J 7/0054; H02J 7/0068; H01M 10/4257; H01M 2010/4271; Y02B 10/72; Y02B 20/46; Y02B 60/1292
See application file for complete search history.

(56) References Cited

U.S. PATENT DOCUMENTS

| 6,556,020 | B1 | 4/2003 | McCabe et al. | |
|---|---|---|---|---|
| 7,612,997 | B1* | 11/2009 | Diebel | G06F 1/1632 361/679.41 |
| 7,843,167 | B2 | 11/2010 | DeRome et al. | |
| 7,876,068 | B2 | 1/2011 | Faunce et al. | |
| 8,491,159 | B2* | 7/2013 | Recker | H02J 9/02 362/20 |
| 8,531,833 | B2* | 9/2013 | Diebel | G06F 1/1628 361/679.41 |

(Continued)

*Primary Examiner* — Vibol Tan
(74) *Attorney, Agent, or Firm* — RatnerPrestia

(57) ABSTRACT

Examples of methods and devices provide a charge level indication of a removable power source of a lighting control device. An example method may include receiving an input indication. A duration of the input is measured. If the measured duration exceeds a predetermined input duration threshold, an indication of a charge level of a removable power supply is obtained. The obtained charge level indication is compared, by a control unit, to a threshold charge level of the power supply. The threshold charge level is indicates an amount of charge remaining in the power supply. In response to a comparison result, an indicator light signal is applied to an indicator light. An example device may include a removable electrical power supply, an input device, an indicator light, and a control unit all of which may cooperate to perform a disclosed method.

23 Claims, 7 Drawing Sheets

(56) References Cited

U.S. PATENT DOCUMENTS

| | | | | |
|---|---|---|---|---|
| 8,764,242 B2* | 7/2014 | Recker | ...................... | H02J 9/02 |
| | | | | 362/20 |
| 2014/0379285 A1* | 12/2014 | Dempsey | ........... | G01R 31/3689 |
| | | | | 702/63 |
| 2016/0041597 A1* | 2/2016 | Graham | ................ | G06F 1/3212 |
| | | | | 713/323 |
| 2016/0330825 A1* | 11/2016 | Recker | ............... | H05B 37/0272 |

* cited by examiner

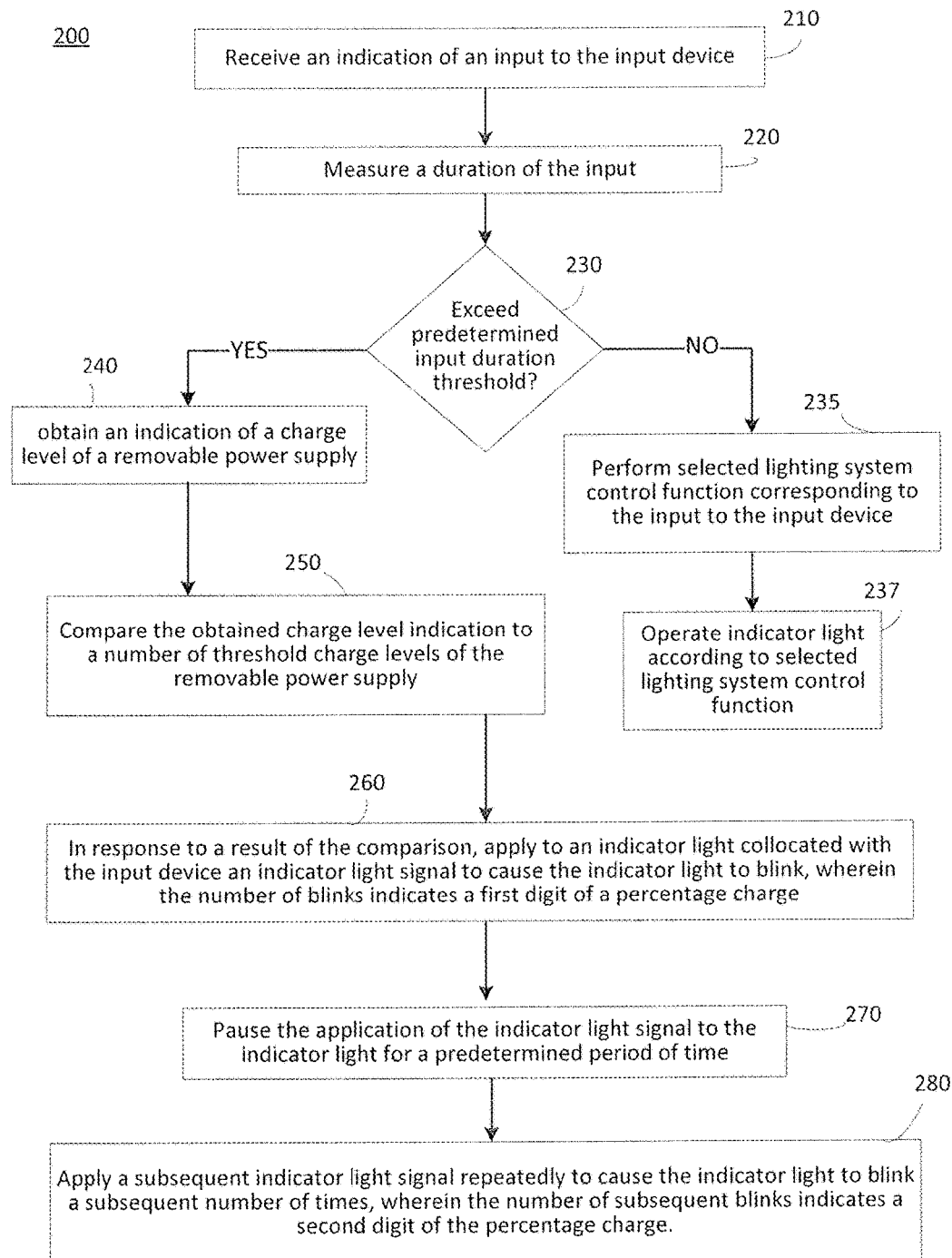

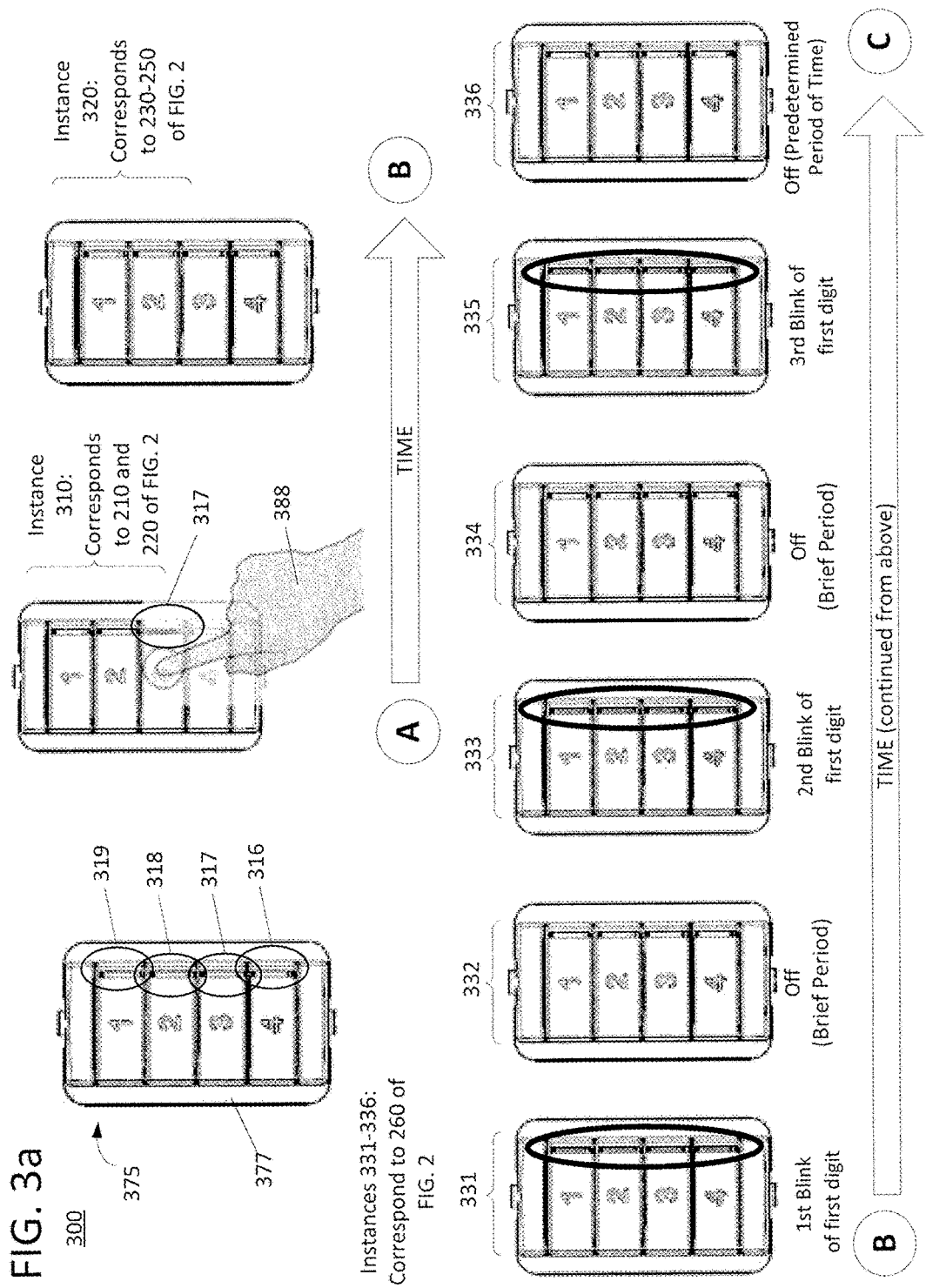

491 — In response to an input received by an input device of a control device, measure a duration of the input received by the input device

492 — In response to the measured duration exceeding a predetermined input duration threshold, output a signal to a charge level detect circuit

493 — Receive a charge level signal from the charge level detection circuit

494 — Determine, by the control unit based on the received charge level signal, a percentage amount of charge remaining in the removable power supply

495 — In response to the determined percentage amount of charge remaining in the removable power supply, illuminate a number of the indicator lights coupled to the control unit, to indicate the determined percentage amount of charge remaining of the removable power supply

LIGHTING CONTROL DEVICE WITH REMOVABLE POWER SUPPLY CHARGE STATE INDICATION AND A METHOD THEREFOR

BACKGROUND

Some recently deployed lighting systems have offered wireless control. For example, a light fixture or a connected power supply may receive an ON/OFF command over-the-air in response to activation of a wall switch or occupancy sensor or the like that communicates the ON/OFF command wirelessly directly or indirectly to fixture or the power supply device to appropriately activate/deactivate the light source in the fixture. A wireless control switch, sensor or other similar wireless lighting control device may include battery power for the wireless transmitter and any other electronics of the lighting control device. A benefit of the wireless, battery powered control device is that the device can be placed at nearly any location that allows wireless communication without connecting to the building's electrical power supply or other wiring.

Present battery powered control devices for lighting applications or the like often have dedicated indicator lights or status display screens or some other means to provide information to a user regarding a status of the device, such as remaining battery power, device state or the like. However, these additional indicators consume remaining battery power and processing resources and require additional space on/in devices that already have limited available space. In addition, the added components and associated wiring not only increase device complexity and cost but also increase manufacturing time and complexity.

SUMMARY

An example of a lighting control device is disclosed that includes a removable electrical power supply, an input device, an indicator light, electrical power charge level detection circuitry and a control unit. The removable electrical power supply has a charge level that diminishes over time. The charge level is an amount of charge available to supply power to the device. The input device is configured to receive a tactile input related to a selected lighting system control function from a user. The indicator light is selectively coupled to the removable electrical power supply. The electrical power charge level detection circuitry is coupled to the removable electrical power supply. The charge level detection circuitry is configured to output a charge level signal indicating a level of charge available for output from the removable electrical power supply. The control unit is coupled to the input device, the electrical power charge level detection circuitry, the indicator light and the removable electrical power supply. The control unit is configured to implement selected lighting system control functions of the device, including functions to in response to each tactile input from a user via the input device, determine whether or not duration of the tactile input exceeds a predetermined duration. For a tactile input of a duration not exceeding the predetermined duration, the control unit is configured to perform the selected lighting system control function of the device based on the tactile input from the user; and operate the indicator light in a first manner to output an indication of actuation of the input device to trigger the selected lighting system control function of the device. For a tactile input of a duration exceeding the predetermined duration, the control unit is configured to receive a charge level signal from the charge level detection circuitry; and operate the indicator light, in a second manner different from the first manner, to output an indication of a present charge level amount of the removable electrical power supply based on received charge level signal.

Disclosed is an example of a method that includes receiving, at a control unit coupled to an input device, an indication of a user input to the input device. A duration of the user input is measured. In response to the measured duration exceeding a predetermined input duration threshold, an indication of a charge level of a removable power supply coupled to the control unit is obtained. The obtained charge level indication is compared, by the control unit, to a threshold charge level of the removable power supply. The threshold charge level is an indication of an amount of charge remaining in the removable power supply. In response to a result of the comparison, an indicator light signal is applied to an indicator light collocated with the input device.

Disclosed is another example of a device including a removable power supply, a charge level detection circuitry, an indicator light, an input device, and a control unit. The removable power supply is configured to output electrical power, and has a charge level. The charge level detection circuitry, the indicator light and the control unit are coupled to the removable power supply. An input device is coupled to the indicator light, and is configured to enable electrical power to be supplied to the indicator light for illumination when the input device is actuated. The control unit is coupled to the charge level detection circuitry, the indicator light and the input device. The control unit is configured to respond to an input received from the input device by measuring a duration of the input received from the input device. In response to the measured duration exceeding a predetermined input duration threshold, the control unit obtains from the charge level detection circuitry a charge level signal. The charge level signal represents an amount of charge remaining in the removable power supply. In response to the received charge level signal, the device presents an indication of the charge level by illuminating the indicator light independent of the actuation of the input device.

Disclosed is an example of another method that includes measuring a duration of the input received by the input device in response to an input received by an input device of a control device. In response to the measured duration exceeding a predetermined input duration threshold, a charge level signal is obtained from the charge level detection circuitry. The obtained charge level signal represents an amount of charge remaining in a removable power supply coupled to the control unit. The control unit, based on the obtained charge level signal, determines a percentage amount of charge remaining in the removable power supply. In response to the determined percentage amount of charge remaining, a number of a plurality of indicator lights coupled to the control unit are illuminated. The number of indicator lights illuminated indicates the determined percentage amount of charge remaining of the removable power supply.

BRIEF DESCRIPTION OF THE DRAWINGS

The drawing figures depict one or more implementation in accord with the present teachings, by way of example only, not by way of limitation. In the figures, like reference numerals refer to the same or similar elements.

FIG. 2 is a flowchart illustrating an example of a process for presenting a charge level indication by a control device, such as the example of control device 20 in FIG. 1.

FIGS. 3a and 3b provide a graphic illustration of a view of a control device when the charge state level indication process example illustrated in the flowchart of FIG. 2 is executed.

FIG. 4 is a flowchart illustrating another example of a process for presenting a charge level indication by a control device, such as the example of control device 20 in FIG. 1.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The presently described examples use existing hardware indicator lights, such as light emitting diodes (LEDs) or other pilot light emitter, that are typically used to present a state (or status) indication of an input device(s) to also visually present an indication of a state or status of an internal parameter, such as battery charge state, or the like. The described examples overcome one or more of the current problems of added power consumption, lack of hardware and space to present an internal parameter state or status, such as the battery charge state, by innovatively utilizing existing indicator light hardware to also indicate power source status. Several disclosed examples use existing hardware at a lighting control device to activate an indicator mode that causes to device to visually report out to a user a battery state (or other internal parameters) in a manner that is easily visible, does not take up additional physical space of the device, or require the use of dedicated hardware.

A number of examples will be described for placing the device in a display mode that facilitates visual presentation of an internal parameter state such as the state of the battery charge, sensor health (e.g., rapid decrease in sensitivity or input signal) or the like. One example utilizes multiple button presses or press and hold sequences that uniquely place the device in the display mode of operation. Once in this mode, the device may visually report the state/status indication results in a number of different ways, such as a bar chart representation of a value using the stacked button LEDs, or a sequence of ON-OFF flashes to represent a value as a multi-digit number, where the number of flashes in a sequence indicates the state (e.g. remaining battery charge level). In a further example, an implementation of the state/status indication may also cause the indicator lights to flash in response to an imminent low battery state, a communication failure, or the like thereby visibly alerting users without being put into a test mode or initial installation mode.

Reference now is made in detail to the examples illustrated in the accompanying drawings and discussed below.

Figure 1:
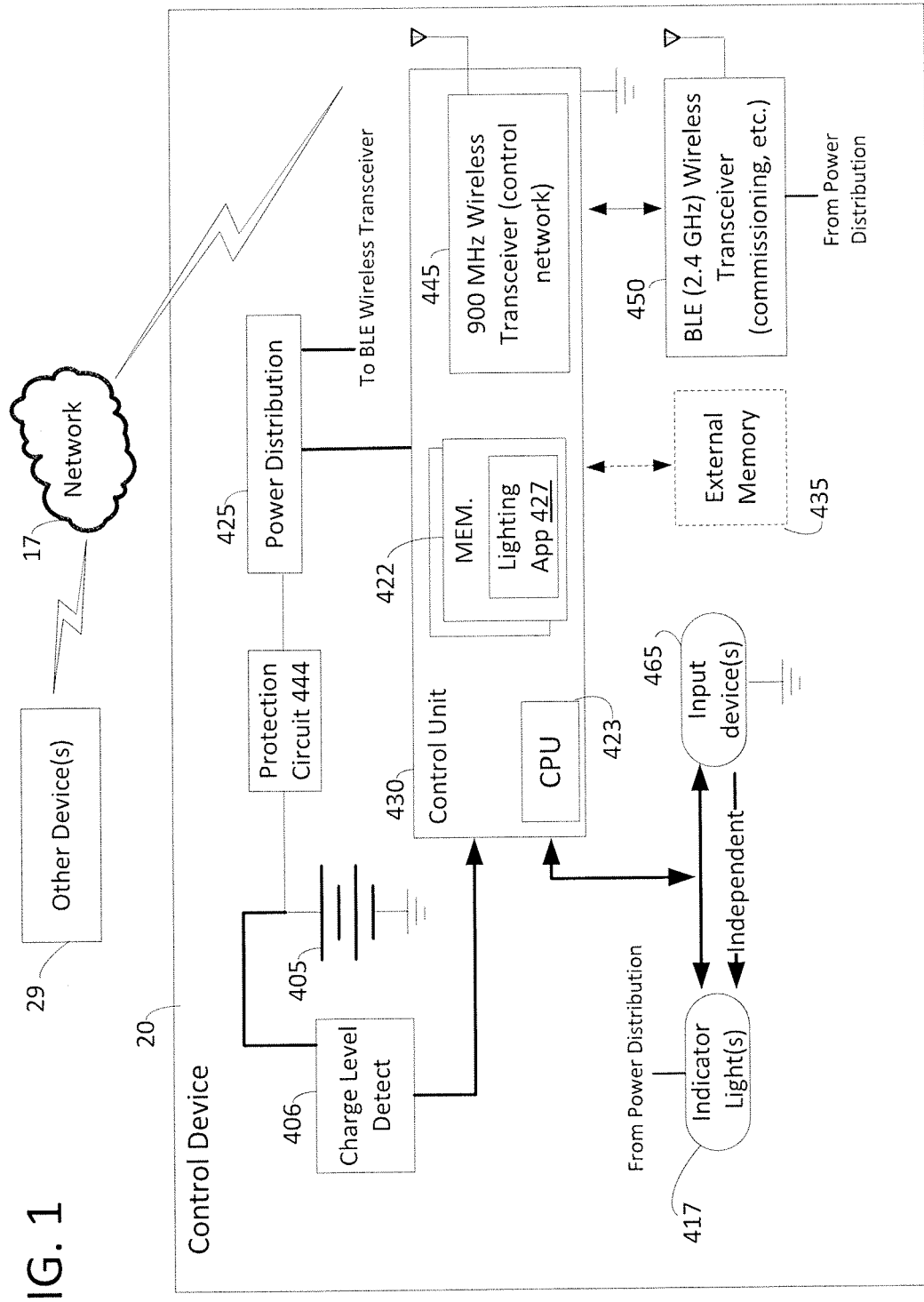
FIG. 1 is a block diagram of an example control device that communicates via a wireless lighting control system.

FIG. 1 is a functional block diagrams of a wireless control device that communicates via the wireless lighting control system. The circuitry, hardware, and software of the control device 20 may be used to communicate via a network 17 with other device(s) 29, such as a luminaire, or a component of the network 17. Control device 20 may be, for example, a wall switch that is a battery powered and communicates wirelessly with the network 17.

As shown, the control device 20 includes a removable power supply 405, such as a disposable or rechargeable battery, is configured to output electrical power for use by the device 20. The removable power supply 405 has a charge level that changes, or diminishes, as time passes. Charge level detection circuitry 406 is coupled to the removable power supply 405, and provides a signal that indicates a charge level of the removable power supply 405. Control device 20 also includes an indicator light 417, which may be a light emitting diode(s) (LED). The indicator light 417 is coupled to the removable power supply 405, and indicates a state of the control device 20 or a state of a component of the control device 20, for example, such as actuation of an input device 465 or the charge level state or status of the removable power supply 405. The input device 465 is coupled to the indicator light. The input device 465 is configured to enable electrical power to be supplied to the indicator light 417 for illumination when the input device 465 is actuated. A micro-control unit, or control unit, 430 is coupled to the removable power supply 405, the charge level detection circuitry 406, the indicator lights 417 and the switches 465.

As shown, the control unit 430 may be a micro-control unit (MCU) that is coupled to indicator LEDs 417 and the input device(s) 465. The control unit 430 includes a memory 422 (volatile and non-volatile) and a central processing unit (CPU) 423. The memory 422 includes a lighting application 427 (which may be firmware) for both lighting control operations and commissioning/maintenance operations. The lighting application 427 may also include computer instructions for receiving inputs from the input device(s) 465 and performing functions in response to the received inputs. The power distribution circuitry 425 distributes power and ground voltages to the LED driver circuit 410, MCU 430, drive/sense circuitry 435, wireless transceivers 445 and 450, and input device(s) 465 to provide reliable operation of the various circuitry on the wall switch 20.

The control device 20 also includes a dual-band wireless radio communication interface system configured for two way wireless communication. In our example, wall switch 12 has a radio set that includes radio 445 for sub-GHz communications and another radio 450 for Bluetooth RF communication. A first radio transceiver 445, such as a 900 MHz wireless radio transceiver, issues control operations on a lighting control network, such as 17 to devices in a lighting system, such as 29 of FIG. 1 in system. In other words, the radio transceiver 445 is coupled to the control unit 430 and is configured to communicate with a lighting control network.

This first transceiver 445 is for any-to-many communication, over a first of the two different wireless communication bands, of control and systems operations information, during luminaire operation and during control network operation over the first wireless communication band.

A second transceiver 450, such as a 2.4 GHz Bluetooth low energy (BLE) wireless transceiver may carry out commissioning and maintenance of the lighting control network. This second transceiver 450 may be for point-to-point communication, over a second of the two different wireless communication bands, of information other than the control and systems operations information, concurrently with at least some communications over the first wireless communication band.

As shown, the control unit 430 includes programming in the memory 422 which configures the CPU (processor) 423 to control operations of the respective wall switch 20, including the communications over the two different wireless communication bands via the dual-band wireless radio communication interface system 445, 450. The programming in the memory 422 may include a real-time operating system (RTOS) and may further include a lighting application 427 which is firmware/software that engages in communications with a commissioning/maintenance application of a mobile device (not shown) over a network. The lighting application 427 programming in the memory 422 carries out lighting control operations over the lighting control network 17, as well as other functions, such as battery charge level indication, related to the control device 20. Alternatively, the control unit 430 of the control device 20 may be coupled to an external memory 435. The external memory 435 may include additional programming, such as battery charge level indication program instructions or the other functions, or data, such as a look up table or the like. For example, the battery charge level indication program instructions may include instructions that require access to data stored in a look up table (e.g., battery voltage values and a corresponding battery charge level). The control unit 430 receives signals from and outputs signals to various devices. For example, the control 430 receives charge level signals from the charge level detection circuitry 406, and receives signals from the input device 465. In addition, the control unit 430 provides control and data signals to the indicator light(s) 417 as well as to the wireless transceiver 450 and/or external memory 435.

The control unit 430, for example, when executing programming stored in memory 422 or external memory 435, is configured to: a) in response to an input, such as a tactile input, a response from a sensor or detector, received from the input device 465, measure a duration of the input received from the input device 465; b) in response to the measured duration exceeding a predetermined input duration threshold, output a signal to the charge level detect circuit 406; c) receive from the charge level detection circuitry 406 a charge level signal, the charge level signal representing an amount of charge remaining in the removable power supply 405; and d) in response to the received charge level signal, present an indication of the charge level by illuminating the indicator light 417 independent of the actuation of the input device 465. In addition, the indicator light 417 indicates the actuation of the input device 465 independent of a signal from the control unit 430, as shown by the arrow labeled independent.

As shown, control device 20 includes input device(s) 465, such as a dimmer switch, set scene switch, an ON/OFF switch, or the like. Input device(s) 465 can also be or include sensors, such as infrared sensors for occupancy or motion detection, an in-fixture daylight sensor, an audio sensor, a temperature sensor, or other environmental sensor. Input device(s) 465 may be based on Acuity Brands Lighting's commercially available xPoint® Wireless ES7 product. The input device(s) 465 may have indicator light emitting diodes (LEDs) 417 associated with one or more of the input device(s) 465.

In an example, if the control device 20 includes is battery 405 powered, the control device 20 may use a sleep function as a means of power conservation. The sleep function requires a special mechanism to acquire certain communications upon wake up, the following operations may take place. The control device 20 may, for example, detect actuation of the input device 465 and may turn on the transceiver 445 and transmit a wireless message with a global broadcast packet as the payload. Next, the control device 20 may cancel its wake up timer (which may be controlled by software instructions stored in the memory 422). The wake up timer function is used to wake the control device 20 to check its network mailbox in the case where no actuation of an input device 465 has occurred for a time. The control device 20 sends a request for communications to a mail box server on a group monitor device (not shown). The group monitor device may return the contents (e.g., messages, commands, or the like) of a mailbox addressed to the control device. In response to receiving the contents of the mailbox, the control device 20 may perform additional functions or may further communicate with devices, such as other devices 29, via the network 17.

The control device 20 also includes a protection circuit 444 and a power distribution circuit 425. The protection circuit 444 protects the electronics in the power distribution 425, the control unit 430 the wireless transceiver 450 and other circuitry from a failure of the removable power supply 405. The power distribution 405 may include circuitry that regulates electrical power provided by the removable power supply 405 and distributes the electrical power to other circuits and electrical components of the control device 20. Examples of the distribution of the electrical power is described in more detail with reference to FIG. 6.

FIG. 2 is a flowchart illustrating an example of a process for presenting a charge level indication by a control device, such as the example of control device 20 in FIG. 1. The process 200 of FIG. 2 includes steps 210-280 that may be executed by a control unit, such as control unit 430, of a control device 20. In the process 200, a control device 20 may receive a tactile input via an input device (e.g. a push of a pushbutton switch), such as input device 465. In response to the tactile input, a control unit coupled to the input device may receive at 210 an indication of an input to the input device. The input indication may last as long as the input device receives the tactile input. Upon receipt of the input indication, the control unit may begin to measure a duration of the input indication (220). The measurement may be performed by a counter or clock that is actuated within the control unit in response to the input indication. The control unit measures the duration of the input indication until the input indication is no longer provided. At 230, the control unit determines whether a predetermined input duration has been exceeded. For example, the control unit may be configured to hold the value of the counter or clock, compare the count or clock value to values in a look up table stored in memory, such as 422 or 435 of FIG. 1, and determine based on the results of the comparison of the count or clock value to the look up table values that the predetermined input duration has either been exceeded or not.

When the input duration has not been exceeded, the control unit interprets this as a selection of, or indication that, a lighting system control function associated with the input device is being requesting and proceeds to step 235. At step 235, the control unit performs the selected lighting system control corresponding to the input to the input device and the indicator light operates in a first manner to output an indication of actuation of the input device to trigger the selected lighting system control function of the device. In the present example, the lighting system control function may be to cause a luminaire turn ON/OFF, a ceiling fan to change a speed, or the like. The lighting control function includes sending, for example, a state change message or the like to other system devices, such as 29 of FIG. 1 in response to which the lighting control function is performed. For example, a lighting control device, such as control device 20, may control one or more luminaires, which are the other system devices 29, by sending a state change message or the like that causes the one or more of luminaires to turn their light sources ON/OFF. Similar processes may be used to control ceiling fans, supplemental air conditioning units or the like. At 237, the indicator light will be operated according to the selected lighting system control function. For example, the indicator light may continue to be lit while the control function is performed, or alternatively, the indicator light may not be lit after the tactile input is no longer applied to the input device.

When the control unit determines at 230 that the input duration has been exceeded, the control unit, in this example, interprets the determination that the input duration has been exceeded as an indication that a function other than the lighting system control function associated with the input device is being requesting. In the present example, the function other than the lighting system control function is an indication of the removable power supply charge function. Of course, there may be other functions, such as a lighting test to identify malfunctioned light sources, smoke or carbon monoxide alarm tests, or the like.

In response to a determination at 230 that the input duration has exceeded the predetermined input duration threshold, the control unit may output a specific signal based on the result of the comparison. For example, the control unit may generate a signal requesting, or causing the output of, a signal from a charge level detection circuitry that detects the present charge level of the removable power supply of the control device. Therefore, at 240, in response to the measured duration exceeding a predetermined input duration threshold, the control unit obtains an indication of a charge level of a removable power supply coupled to the control unit.

The process 200 continues at 250 by comparing, by the control unit, the obtained charge level indication to a threshold charge level of the removable power supply. The threshold charge level may be an indication of an amount of charge remaining in the removable power supply. For example, in the case where the charge level is divided into 100 increments, the threshold charge level may nearly match the charge level signal. Alternatively, when the threshold charge level is only 4 increments (i.e., 25%, 50%, 75% and 100%), the threshold charge level (e.g., 25%) and the charge level signal (e.g., 48%) may be as close of a relative match, so the presented charge level indication would be equal to 25%. Of course more sophisticated algorithms may be applied so the charge level signal (e.g. 48%) is "rounded up" when closer to a next threshold charge level (in this example, 50%). In an example, the comparison at 250 may include comparing the obtained charge level to a comparison threshold iteratively selected from a number of comparison thresholds. Each of the number of thresholds may, for example, indicate a different percentage of an amount of charge remaining in the removable power supply. For example, the number of thresholds may be determined based on divisors of 100, such as 1s, 2s, 5s, 10s, 25s or fractions of 100, such as 10ths, 4ths, 5ths, or the like. To further explain, if the divisor is 1, the number of thresholds would equal 100. Alternatively, if the divisor is 25, the number of thresholds would equal 4. The comparison process of 250 continues when in response to the obtained charge level being below the selected comparison threshold, a charge signal indicating the charge level of the removable power supply is output. The charge signal corresponds to an immediately preceding comparison threshold. For example, the charge signal may be a scaled voltage of the present removable power supply voltage. In this example, the charge signal is the result of the comparison.

The control unit receives the charge signal and interprets the charge signal, for example, as a percentage of charge, or some other parameter that quantifies the threshold charge level indication of the removable power supply charge level. Based on the interpretation, an indicator light signal is generated. In other words, the indicator light is operated, in a second manner different from the first manner, to output an indication of a present charge level amount of the removable electrical power supply based on received charge level signal. At 260, in response to the result of the comparison, one or more indicator light signals may be applied to an indicator light collocated with the input device, or simultaneously one or more other indicator lights on the control device. The application of the indicator light signal corresponds to the threshold charge level indication of the removable power supply charge level. In this example, the indicator light signal is applied to the indicator light a number of time to cause the indicator light to blink. The number of blinks indicating a first digit of the percentage of charge. For example, if the percentage of charge is 32%, the indicator light signal is applied three (3) times. At 270, the control unit pauses the application of the indicator light signal to the indicator light for a predetermined period of time, such as 0.5-2 seconds. During the pause, the indicator light may not emit light for the predetermined period of time. Alternatively, the control unit may continue to apply the indicator light signal and the indicator light will emit light continuously for the predetermined period of time.

After the predetermined period of time expires, the control unit at 280 applies a subsequent indicator light signal to cause the indicator light to blink a subsequent number of times. The subsequent number of blinks indicates a second digit of the percentage charge. In the example in which the threshold charge level is 32%, the subsequent number of blinks would be 2. Based on the initial number of blinks and the subsequent number of blinks, a user could ascertain that the charge level of the removable power supply is 32% of a 100% charge level. It may be helpful to the understanding of the above described process example to provide a discussion with respect to a front view of a control device when the process 200 is executed.

Figure 3B:
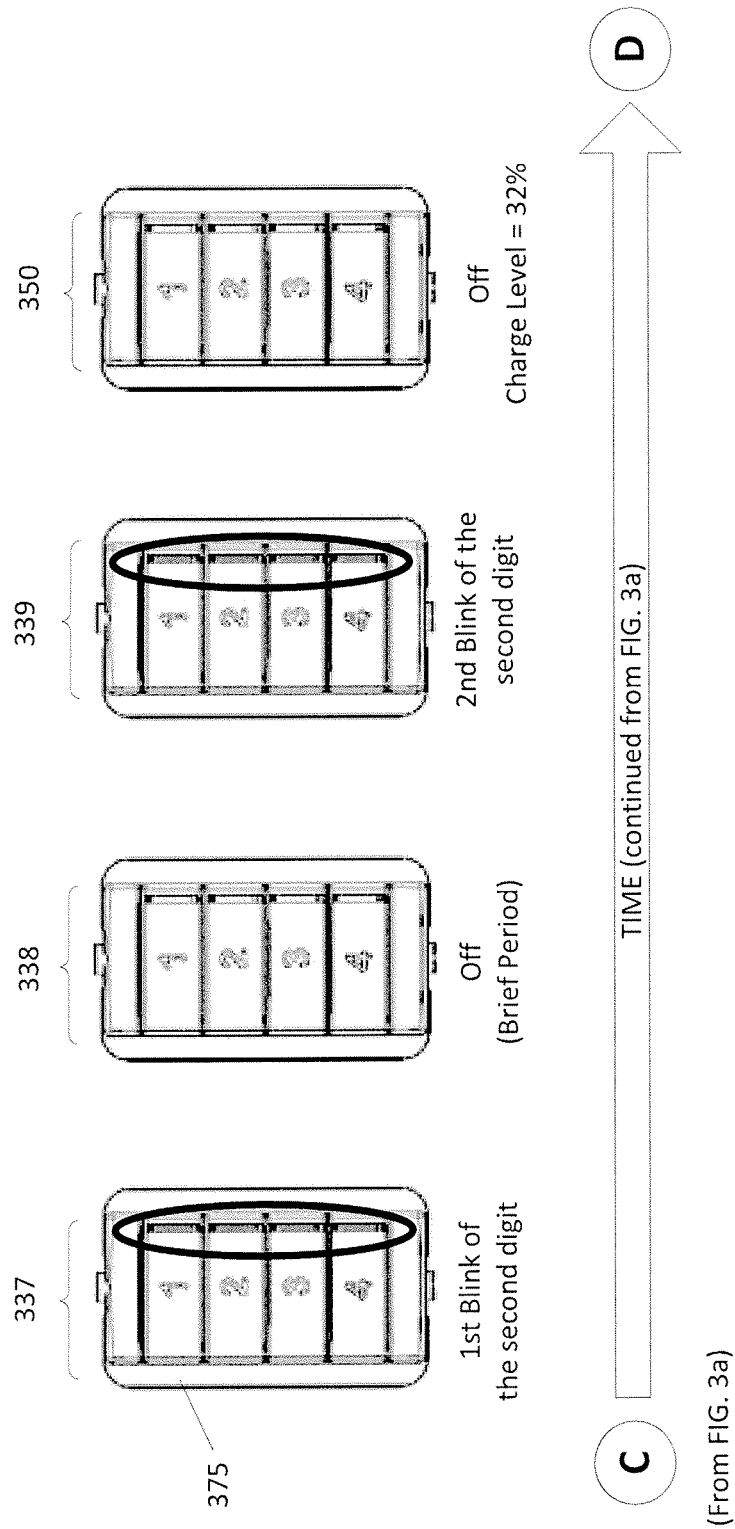

FIGS. 3a and 3b provide a graphic illustration of a view of a control device when the charge state level indication process example illustrated in the flowchart of FIG. 2 is executed. A wireless control device, such as device 375 of FIG. 3a may be powered by a removable power supply, such as 405 of FIG. 1, and be connected in a network. The wireless control device 375 of FIG. 3a may have several input devices, labeled as 1-4, that control one or more devices, such as luminaires, ceiling fans, wall outlets or the like.

The process 200 described above with reference to FIG. 2, in this example, is performed by the control device 375 illustrated in FIGS. 3a and 3b. The control device 375 may be configured in the same manner as control device 20 described above with reference to FIG. 1.

In the example of FIGS. 3a and 3b, the control device 375 includes a number of input devices labeled 1, 2, 3 and 4, and a number of indicator lights 316-319. Each of the respective number of input devices 1-4 is associated with a respective one of the number of indicator lights 316-319. In other words, each of input devices labeled 1-4 has a respective indicator light 316-319 that respectively emit light when the associated input device is actuated (e.g., receives a tactile input). Structurally, the control device 375 may include a lighting control device housing 377 that is mountable at a surface of a premises, such as in or on a wall of a room, in or on an exterior wall of a building or the like. For example, the housing may be connectable to a box, e.g. "electrical gang box", installed in drywall. The lighting control device housing 377 may be configured to contain the input devices 1-4 and the indicator lights 316-319 within the control device 375.

The process 300 proceeds through steps 331-339 and 350 that develops over a period of time from an initial time A to a time B, from time B to time C as shown in FIG. 3a, and, from time C to time D as shown in FIG. 3b.

The following discussion references FIGS. 3a and 3b as well as the process steps of FIG. 2. The process 300 begins at initial time A, when input device 3 of the control device 375 receives a tactile input from a user 388. In response to the tactile input to input device 3, the indicator light 317 associated with input device 3 emits light while the tactile input is applied to input device 3. The process steps 210 and 220 as described above occur when the control device 375 is interacted with by a user, such as user 388 as shown generally at instance 310. Assuming the user 388 maintains the tactile input for a time that exceeds the predetermined input duration threshold, the controller (not shown in this example) of control device 375 may execute steps 240 and 250 of FIG. 2 at instance 320 (to time B, for example). At the transition from time B to time C, the process step of 260 may be executed by the control unit of the control device 375. An example view of the control device 375 during process step 260 may appear as shown in instances 331-336. In the example of FIG. 2, the threshold charge level was equal to 32%. Since the first digit in the threshold charge level is "3", the control unit applies the indicator light signal three times to all of the indicator lights 316-319 on the control device 375. At instance 331, indicator lights 316-319 are shown as simultaneously emitting light for a brief period as a first ($1^{st}$) blink. The brief period only needs to be long enough to be perceptible (e.g., 0.25 seconds or the like) as a blinking light. At instance 332, the indicator lights 316-319 are unlit by the control unit for a brief period of time. The indicator lights 316-319 emit light for a second ($2^{nd}$) blink (instance 333), and then remains unlit for the brief period of time (instance 334). At instance 335, the indicator lights 316-319 blink for a third ($3^{rd}$) blink, and then remain unlit for another period of time at 336. In all, the indicator lights 316-319 blinked three times in relatively short amount of time. The predetermined period of time at 336 is longer than brief OFF periods of time between the first ($1^{st}$) and second ($2^{nd}$) blinks and the second ($2^{nd}$) and third ($3^{rd}$) blinks. The purpose of the predetermined time period in which the indicator lights 316-319 are OFF (at instance 336) and the pause at step 270 of FIG. 2 is to differentiate to the viewer the blinks that indicate the first digit of the threshold charge level from the blinking indicator lights that indicate the second digit of the threshold charge level. At time C, the process 300 is waiting for the predetermined period of time (at instance 336 and in step 270 of FIG. 2) to pass. In FIG. 3b, at instance 337, the predetermined period of time still has not expired, and time continues to pass. At instance 338, the control unit (as in step 280 of FIG. 2) applies a subsequent indicator light signal to cause the indicator light to blink a subsequent number of times. The subsequent number of blinks indicates a second digit of the percentage charge. Recall that, in the example, the threshold charge level is 32%; therefore, the subsequent number of blinks is two (2). After the predetermined time period has expired, the control unit at instance 337 causes the indicator lights 316-319 to emit light for a brief period as a first ($1^{st}$) blink of the second digit. After the first blink of the second digit, the control unit causes the indicator lights 316-319 to be unlit for a brief period emit light at 338. At instance 339, the control unit again applies an indicator light signal to cause the indicator lights 316-319 to emit light and output a second blink of the second digit. The control unit may end the charge level indication function, and the control device 375 indicator lights 316-319 remain OFF. At this point, the view must recall the number of blinks (3) before the predetermined time period that is longer than the brief (OFF) period between blinks and the number of blinks after the predetermined time period (2). Based on the recollection of the number of respective blinks prior to the predetermined time period at instance 336 and after the predetermined time period at instance 336, the viewer is able to ascertain that the charge level is 32%. Of course, other percentage charge levels may be presented other than 32%. For example, if 6 blinks are prior to the predetermined time period at instance 336 and 8 blinks are after the predetermined time period at instance 336, the charge level is 68%. The use of blinking indicator lights is but one example for presenting a charge level indication. Another may be to use the four indicator lights 316-319 as a form of bar graph presentation.

A process for providing such a bar graph presentation is described with reference to FIGS. 4 and 5. FIG. 4 is a flowchart illustrating another example of a process for presenting a charge level indication by a control device, such as the example of control device 20 in FIG. 1.

The process 400 may be implemented by a control unit within a control device, such as control device 20 of FIG. 1 or 375 of FIG. 3. In response to a tactile input applied to input device, such as 465 of FIG. 1, the process 400 at 491 measures a duration of the input received by the input device. In addition, an indicator light, such as 417, associated with the input device 465 may emit light. As mentioned above, a control unit, such as 430, within the control device 20 may start a clock or a counter in response to receiving the indication of the tactile input. At 492, in response to the measured duration exceeding a predetermined input duration threshold, the control unit may output a signal to a charge level detect circuit coupled to the control unit of the control device. After output of the signal to the charge level detect circuit, the control unit at 493 receives a charge level signal from the charge level detection circuitry. The received charge level signal may represent an amount of charge remaining in a removable power supply. For example, the received charge level signal may be a scaled voltage corresponding to the voltage of the removable power supply. The control unit, based on the received charge level signal, determines at 494 a percentage amount of charge remaining in the removable power supply. In response to the determined percentage amount of charge remaining, the control unit may illuminate a number of a plurality of indicator lights coupled to the control unit. The number of the indicator lights illuminated indicates the determined percentage amount of charge remaining of the removable power supply (495).

As discussed above, it may be helpful to explain the process 400 with reference to a graphic of the control device. FIG. 5 provides a graphic illustration of another view of a control device when the other example of a charge state level indication process illustrated in the flowchart of FIG. 4 is executed by a control unit.

Figure 5:
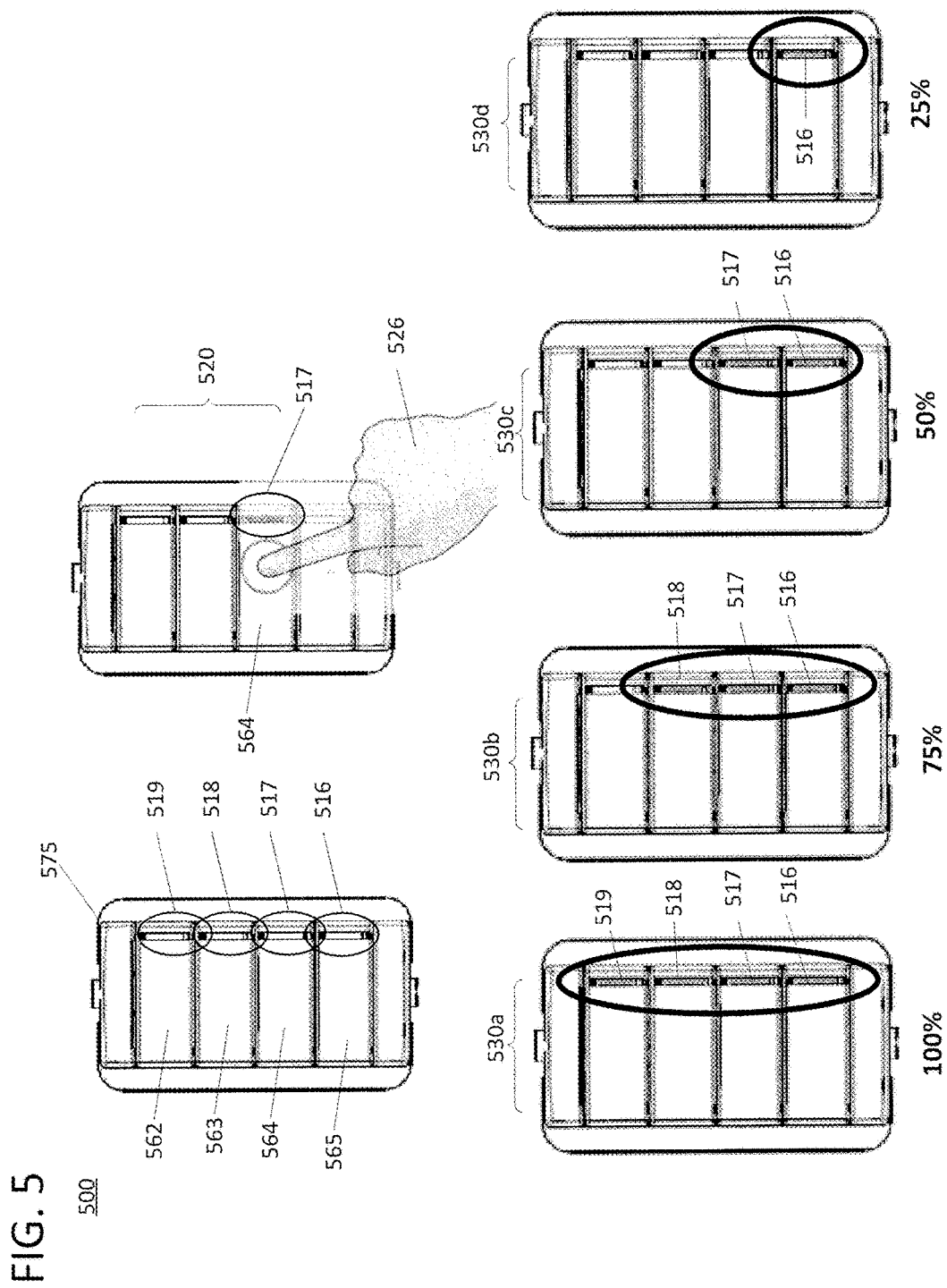
FIG. 5 provides a graphic illustration of another view of a control device when the other example of a charge state level indication process illustrated in the flowchart of FIG. 4 is executed.

A wireless control device, such as device 575 of FIG. 5 may be powered by a removable power supply, such as 405 of FIG. 1, and be connected in a network, such as 17. The wireless control device 575 of FIG. 5 may have several input devices, labeled as 562-564, that provide one or more lighting system control functions. Each of the respective input devices 562-564 may have an indicator light, such as 516-519, associated with it. For example, the control device 575 may control via input devices 562-564 one or more devices, such as luminaires, ceiling fans, wall outlets or the like.

A user may provide a tactile input one input device 564 of the number of input devices 562-565 of the control device 575. The indicator light 517 associated with input device 564 may emit light in response to the tactile input to input device 564. A control unit (not shown in this example) of the control device 575 may receive an indication of the input to input device 564. At 520, in response to the input indicated by circle beneath the user 526 finger received by the input device 564 of a control device 575, a duration of the input received by the input device 564 may be measured by a control unit (see, for example, FIG. 4, step 491). The control unit may perform a number of functions, such as 492-494, in the same manner as described above with reference to FIG. 4. For example, the control unit may determine a remaining amount of percentage charge level by comparing the charge level signal received from the charge level detection circuitry to a look up table the control unit accesses in a data storage, such as memory 422, lighting application 427 or external memory 435.

In response to the determination of the percentage amount of charge remaining in the removable power supply, the control unit may illuminate a number of the indicator lights on the control device to provide a charge level indication to a user, such as user 526. Examples of the illumination of a number of the indicator lights based on the determined percentage amount of charge remaining of the removable power supply are illustrated in 530*a*-530*d* of FIG. 5. For example, if the determined percentage amount of charge remaining of the removable power supply indicates 100%, the control unit may generate indicator light signals to each of the indicator lights 516-519. In response to receiving the indicator light signals, the indicator lights 516-519 to indicate the percentage amount of charge remaining, which in the example 530*a* is 100%. In example 530*b*, the determined percentage amount of charge remaining is 75%. In the 530*b* example, the control unit only applies indicator light signals to indicator lights 516-518. Similarly, in the example 530*c*, the determined percentage amount of charge remaining is 50%. In the 530*c* example, the control unit only applies indicator light signals to indicator lights 516 and 517. The determined percentage amount of charge remaining is 25% in the 530*d* example, in which case the control unit only applies an indicator light signal to indicator light 516.

While the example of FIG. 5 only shows four indicator lights 516-519 and the indicated percentages of remaining charge level only as 25, 50, 75 and 100%, the number of indicator lights may be more or less and as such, the indicated percentages may also correspond to the number of indicator lights. For example, if there were five (5) indicator lights, the indicated percentages of remaining charge levels may be 20, 40, 60, 80 and 100%, or if the number of indicator lights is three (3), the indicated percentages of remaining charge levels may be 33, 66, and 100%. Of course, the foregoing list of examples is not intended to be exhaustive, and other examples may be implemented to provide the charge level indication function as described in the above examples.

While the above processes discussed in FIGS. 2-5 were described as being implemented by a single input device actuation past a threshold duration, multiple input devices may be simultaneously actuated past threshold duration to initiate other functions or request other information. For example, while the above described examples described a charge level indication function, other functions, such as a sensor (e.g., smoke detector, carbon monoxide, carbon dioxide, or the like) health indication function may also be provided using a similar process.

The above examples reference the interaction of different components of a control device to provide the charge level indication function as described herein. It may be helpful to describe an implementation including the different components with reference to a schematic diagram. One example of a high-level schematic is presented in FIG. 6 and will now be described in more detail.

Figure 6:
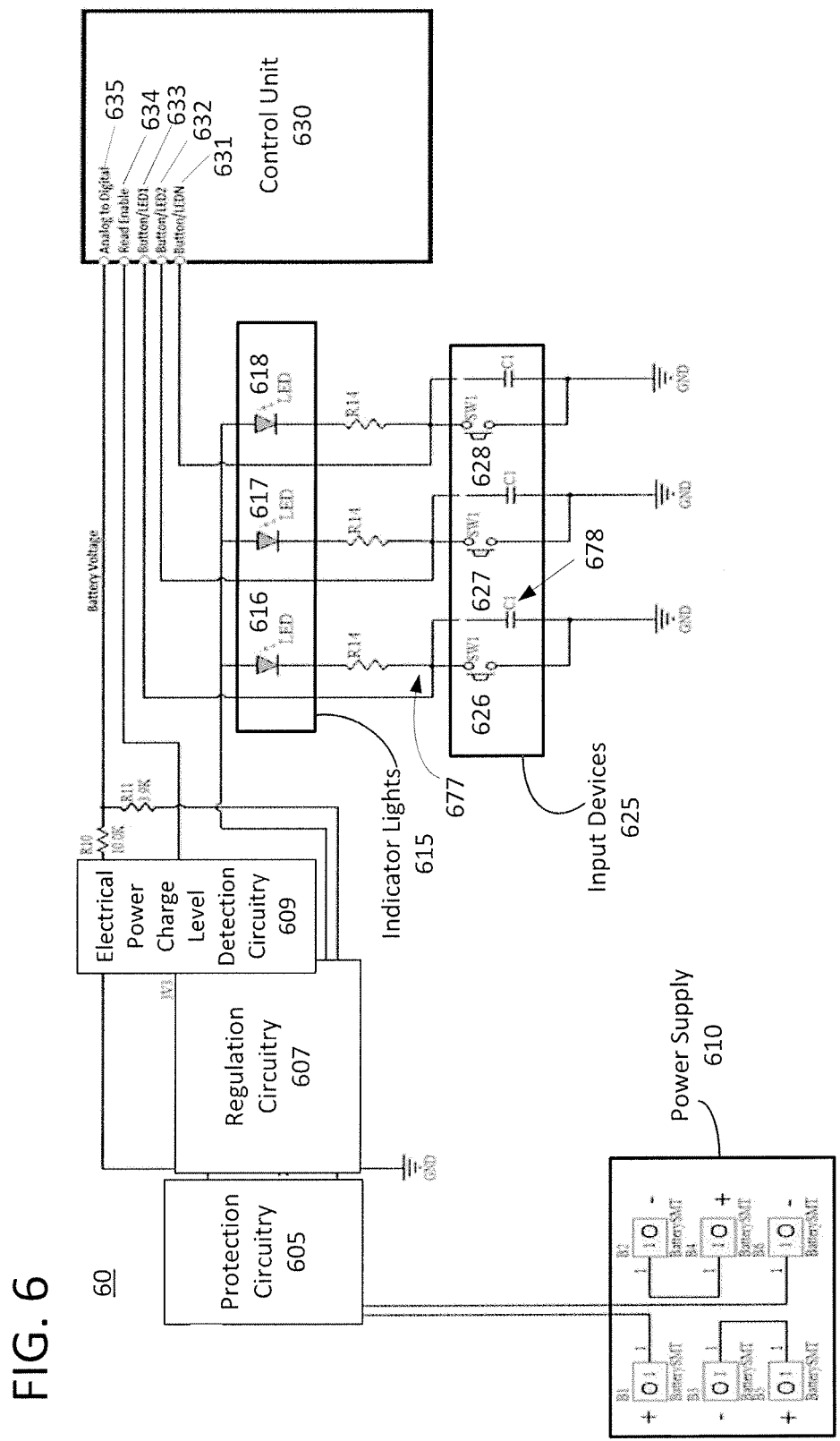
FIG. 6 is a high-level schematic diagram of an example implementation of a control device configured to execute a battery charge state level indication procedure.

FIG. 6 is a high-level schematic diagram of an example implementation of a control device configured to execute a battery charge state level indication procedure.

In the example of FIG. 6, the control device 60 includes a control unit 630, a removable power supply 610, protection circuitry 605, regulation circuitry 607, electrical power charge level detection circuitry 609, a number of indicator lights, collectively referred to as 615, and a number of input devices, collectively referred to as 625. The control unit 630 is coupled to the regulation circuitry, the electrical power charge level detection circuitry 609, the indicator lights 615 and the input devices 625. The protection circuitry 605 is configured to protect the control unit 630, the regulation circuitry 607 and the electrical power charge level detection circuitry 609 from a failure of the power supply 610. The number of indicator lights 615 include individual lights 616-618, and the number of input devices 626 include individual input devices 626-628. While only three indicator lights and three input devices are shown, more or less indicator lights and/or input devices may be accommodated by the example of FIG. 6.

The control unit 630 is coupled to the removable power supply 610, the electrical power charge level detection circuitry 630, each of the number of indicator lights 615, and each of the number of input devices 625. The control unit 630 is configured to perform various functions related to lighting control, such as transmit lighting system control signals to devices, such as other devices 29 of FIG. 1, and connected to a lighting system network, such as network 17 as well as perform functions related to the state and/or status of the control device, such as the charge level indication function as described above with respect to FIGS. 2-5. The control unit 630 includes a number of terminals 631-635 through which the control unit receives inputs or provides output to the various components of the control device 60. For example, terminals 631-633 are respectively coupled to an individual indicator light of the number of indicator lights 615 and to a respective individual input device of the number of input devices 625. In more detail, terminal 631 is coupled to indicator light 616 and input device 626. Similarly, terminals 632 and 633 would be connected respectively to the other two indicator lights of the number of indicator lights 615 and other two input devices.

The control unit 630 also includes terminals 634 and 635 that are coupled to the electrical power charge level detection circuitry 609. The terminal 634 is used by the control unit 630 to signal the electrical power charge level detection circuitry 609 to measure a parameter, such as voltage or current, of the removable power supply 610. For example, the control unit 630 may send a signal via terminal 634 to electrical power charge level detection circuitry 609 requesting an indication of the charge level of the power supply 610. In response to the signal, the electrical power charge level detection circuitry 609 provides scaled voltage corresponding to the charge level of the power supply 610 that is detected by the control unit 630 via terminal 635. The scaled voltage corresponding to the charge level of the power supply 610 is a charge level signal or a charge level indication.

The removable power supply 610 is configured to output electrical power, and as such the removable power supply has a charge level that diminishes over time. The removable power supply 610 may be a battery, such as one or more alkaline or lithium-based AAA, AA, button-type or other size or type of battery having a form factor and electrical power specifications suitable for use in control device 60. The regulation circuitry 607 is configured to ensure that a regulated voltage and current is supplied to the various components of the control device 60 to operate.

The electrical power charge level detection circuitry 609 is an electrical power charge level detection circuitry coupled to the removable power supply that is configured to detect an amount of charge remaining on the removable power supply. 610. For example, the electronic circuitry of the electrical power charge level detection circuitry 609 is configured to measure a parameter of the electrical power supply; and in response to the measured parameter, output the charge level signal to the control unit 630. The charge level signal is a scaled voltage of a voltage detected by the electrical power charge level detection circuitry.

The number of input devices 625 may include individual input devices, such as 626. Input device 626 in this example is a non-latching pushbutton switch or momentary switch. The number of indicator lights 615 illuminate to indicate a state of the number of input devices 625. For example, the input device 626 is a pushbutton device indicator light 616 of the number of indicator lights 615 is illuminated in response to actuation of input device 626.

Each input device of the number input devices 625 is coupled to an individual indicator light of indicator lights 615, and is configured to, upon actuation of the input device, deliver electrical power to the individual indicator light to which the input device is coupled. The indicator light indicates the actuation of the input device independent of a signal from the control unit 630.

Individual indicator lights, such as 616, of the number of indicator lights 615 are coupled to the removable power supply 610 via the regulation circuitry 607. The regulation circuitry 607 supplies regulated electrical power from the removable power supply 610 to the indicator light 616. In the example of FIG. 6, indicator light 616 is coupled to input device 626. The indicator lights 615 may be light emitting diodes (LEDs). As shown in the example, the anode of the LED 616 may be coupled to the regulation circuitry 607 and the cathode of the LED 616 is coupled to a first terminal of the input device 626, which in the example is a pushbutton switch. A second terminal of the input device 626 is coupled to ground (GND). A capacitor 678 is coupled in parallel with input device 626 at node 677 and at GND. The cathode of the LED 616, the first terminal of the input device 626 and a first terminal of the capacitor 678 as well as LED terminal 633 of the control unit 630 are coupled to node 677.

The indicator light 616 may be lit by two different operations. In a first operation, the indicator light 616 may be lit independent of the actuation of the input device 626. The capacitor 678, when charged, operates to maintain a voltage at node 677. The maintained voltage at node 677 is sufficient to cause the voltage difference across the LED 616 to be at a level that an electrical current sufficient to cause the LED 616 to emit light does not flow through the LED 616. The control unit 630 is configured to in response to execution of a computer program instructions, such as those for executing the above described charge level indication functions, to reduce the voltage at node 677 by causing a state of terminal 633 to change. As a result of the change in state at terminal 633 of the control unit 630, the capacitor 678 begins to discharge and the voltage at node 677 goes lower. As a result of the lower voltage at node 677, the voltage at the anode of the LED 616 is higher than the voltage at node 677. Consequently, a current sufficient to cause the LED 616 to emit light is provided by the regulation circuit 607 to the anode of the LED 616 which flows through the LED 616 to node 677. In other words, the controller 630 may cause the indicator light 616 to emit light independent of actuation of the input device 626.

Conversely, actuation of the input device 626 causes the respective indicator light 616 to emit light independent of a signal from the controller 630. For example, as explained above, the capacitor 678, when charged, operates to maintain a voltage at node 677. The maintained voltage at node 677 is sufficient to cause the voltage difference across the LED 616 to be at a level that an electrical current sufficient to cause the LED 616 to emit light does not flow through the LED 616. However, when input device 626 is actuated, the voltage at node 677 goes lower because the voltage at node 677 and the charge on capacitor 678 dissipates to GND. As a result, an electrical current sufficient to cause the LED 616 to emit light flows through the LED 616. A benefit of this arrangement is that actuation of input device illuminates the indicator light 616 without direct involvement of the control unit 630. This saves power and processing resources and reduces complexity by not requiring software coding for illuminating the indicator lights 615 whenever an input device 625 is actuated.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," "includes," "including," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "a" or "an" does not, without further constraints, preclude the existence of additional identical elements in the process, method, article, or apparatus that comprises the element.

Unless otherwise stated, any and all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present concepts.

What is claimed is:

1. A lighting control device, comprising:
    a removable electrical power supply having a charge level that diminishes over time, wherein the charge level is an amount of charge available to supply power to the device;
    an input device configured to receive a tactile input related to a selected lighting system control function from a user;
    an indicator light selectively coupled to the removable electrical power supply;
    electrical power charge level detection circuitry coupled to the removable electrical power supply, the charge level detection circuitry configured to output a charge level signal indicating a level of charge available for output from the removable electrical power supply; and
    a control unit coupled to the input device, the electrical power charge level detection circuitry, the indicator light and the removable electrical power supply, the control unit configured to implement selected lighting system control functions, including functions to:
        in response to each tactile input from a user via the input device, determine whether or not duration of the tactile input exceeds a predetermined duration;
    (a) for a tactile input of duration not exceeding the predetermined duration:
        perform the selected lighting system control function of the device based on the tactile input from the user; and
        operate the indicator light in a first manner to output an indication of actuation of the input device to trigger the selected lighting system control function of the device; and
    (b) for a tactile input of duration exceeding the predetermined duration:
        receive a charge level signal from the charge level detection circuitry; and
        operate the indicator light, in a second manner different from the first manner, to output an indication of a present charge level amount of the removable electrical power supply based on received charge level signal.

2. The device of claim 1, wherein:
    the removable electrical power supply is a battery; and
    the charge level is a scaled voltage of a voltage detected by the electrical power charge level detection circuitry.

3. The device of claim 2, wherein the control unit is further configured to:
    in response to receiving the charge level signal from the electrical power charge level detection circuitry, compare the charge level signal to a threshold; and
    based on the results of the comparison, apply one or more indicator light signals to the indicator light.

4. The device of claim 1, wherein the electrical power charge level detection circuitry is further configured to:
    measure a parameter of the electrical power supply; and
    in response to the measured parameter, output the charge level signal to the control unit.

5. The device of claim 1, wherein the indicator light is coupled to the input device, each input device enabling delivery of electrical power to an indicator light upon actuation of the input device, wherein the indicator light indicates the actuation of the input device; and
    the control unit is further configured to:
        apply one or more indicator light signals to the indicator light independent of the actuation of the input device, wherein the indicator light indicates the level of charge available.

6. The device of claim 1, further comprising:
    a radio transceiver coupled to the control unit, the radio transceiver configured to communicate with a lighting system,
    wherein:
        the input device is further configured as a wall switch that is actuated in response to the tactile input; and
        the control unit is further configured to:
            in response to receiving an indication of the switch actuation from the control unit, begin implementation of the selected lighting system control function associated with actuation of the wall switch.

7. A method, comprising:
    receiving, at a control unit in a lighting control system in which the control unit is coupled to an input device, an indication of a user input to the input device associated with a lighting control function;
    measuring a duration of the user input to the input device;
    in response to the measured duration exceeding a predetermined input duration threshold, obtaining an indication of a charge level of a removable power supply coupled to the control unit;
    comparing, by the control unit, the obtained charge level indication to a threshold charge level of the removable power supply, wherein the threshold charge level is an indication of an amount of charge remaining in the removable power supply; and
    in response to a result of the comparison, applying an indicator light signal to an indicator light collocated with the input device.

8. The method of claim 7, wherein the obtained indication of a charge level of a removable power supply is a charge level signal from a charge level detection circuitry coupled to the control unit.

9. The method of claim 7, wherein the comparison further comprises:
    comparing the obtained charge level to a comparison threshold iteratively selected from a plurality of comparison thresholds, each of the plurality of thresholds indicating a different percentage of the amount of charge remaining in the removable power supply; and
    in response to the obtained charge level being below the selected comparison threshold, outputting a charge signal indicating the charge level of the removable power supply, the signal corresponding to an immediately preceding comparison threshold.

10. The method of claim 7, wherein applying the indicator light signal to the indicator light collocated with the input device comprises:

applying the indicator light signal repeatedly to cause the indicator light to blink, wherein the number of blinks indicates a first digit of the percentage charge;
pausing for a predetermined period of time; and
applying a subsequent indicator light signal repeatedly to cause the indicator light to blink a subsequent number of times, wherein the number of subsequent blinks indicates a second digit of the percentage charge.

11. A control device for use in a wireless lighting control system, comprising:
a removable power supply configured to output electrical power, the removable power supply having a charge level;
charge level detection circuitry coupled to the removable power supply;
an indicator light coupled to the removable power supply;
an input device associated with a lighting control function in the wireless lighting control system coupled to the indicator light, the input device configured to enable electrical power to be supplied to the indicator light for illumination when the input device is actuated;
a control unit coupled to the removable power supply, the charge level detection circuitry, the indicator light and the input device, the control unit configured to:
in response to an input received from the input device associated with the lighting control function, measure a duration of the input received from the input device;
in response to the measured duration exceeding a predetermined input duration threshold, output a signal to the charge level detection circuitry;
receive from the charge level detection circuitry a charge level signal, the charge level signal representing an amount of charge remaining in the removable power supply; and
in response to the received charge level signal, present an indication of the charge level by illuminating the indicator light independent of the actuation of the input device.

12. The control device of claim 11, wherein the control device comprises:
a plurality of indicator lights; and
a plurality of input devices,
wherein:
each of the plurality of input devices is associated with an indicator light; and
each of the indicator lights illuminates to provide an indication of a state of the associated input device or of the control device.

13. The control device of claim 12, the control unit further configured to:
in response to the received charge level signal, illuminate a number of the plurality of indicator lights based on a voltage of the received charge level signal, wherein the number of the indicator lights illuminated indicates the charge level of the removable power supply.

14. The control device of claim 11, wherein the charge level detection circuitry is configured to:
in response to receiving the signal output by the control unit, provide a voltage as the charge level signal to the control unit, wherein the voltage is representative of the amount of charge remaining in the removable power supply.

15. The control device of claim 11, wherein the input device and the indicator light are positioned adjacent to one another.

16. The control device of claim 11, the control unit further configured to:
apply the indicator light signal repeatedly to cause the indicator light to blink, wherein the number of blinks indicates a first digit of the percentage charge;
pause for a predetermined period of time; and
apply a subsequent indicator light signal repeatedly to cause the indicator light to blink a subsequent number of times, wherein the number of subsequent blinks indicates a second digit of the percentage charge.

17. The control device of claim 11, wherein the control unit, the input device, the indicator light and the removable power supply are coupled in a configuration enabling:
the input device to illuminate the indicator light independent of the control unit.

18. The control device of claim 11, wherein the input device is a non-latching pushbutton switch or momentary switch.

19. The control device of claim 11, wherein the control unit is further configured to:
convert the received charge level signal to an indicator light signal number, the indicator light signal number equal to a number of times the indicator light signal is to be applied to the indicator light within a predetermined time period; and
in response to a result of the conversion, apply an indicator light signal to the indicator light for the number of times within the predetermined time period to cause the indicator light to blink in a manner visually perceptible to a user, wherein the number of times the indicator light signal is applied indicates an amount of charge remaining in the removable power supply.

20. The control device of claim 19, wherein the control unit is further configured to:
determine from the indicator light signal number a ten's-place ordinal value and a one's-place ordinal value;
in response to the determined tens-place ordinal value, apply for a predetermined duration a number of indicator light signals to the indicator light in succession until the number of applied indicator light signals is equal to the ten's place ordinal value;
pause for another predetermined period of time; and
apply for a predetermined duration a number of indicator light signals to the indicator light in succession until the number of applied indicator light signals is equal to the one's place ordinal value.

21. The control device of claim 11, the control unit is further configured to:
determine based on the received charge level signal, a percentage amount of charge remaining in the removable power supply; and
when presenting an indication of the charge level by illuminating the indicator light, the control unit is configured to:
apply the indicator light signal repeatedly to cause the indicator light to blink when illuminated, wherein the number of blinks indicates a first digit of a percentage charge;
pause the applying for a time interval;
re-apply a subsequent indicator light signal repeatedly to cause the indicator light to blink when illuminated.

22. The control device of claim 21, wherein the number of blinks resulting from the reapplication of the subsequent indicator light signal indicates a second digit of the percentage amount charge of charge remaining in the removable power supply.

23. A method, comprising:
in response to an input received by an input device of a control device in a wireless lighting control system, measuring a duration of the input received by the input device associated with a lighting control function;
in response to the measured duration exceeding a predetermined input duration threshold, obtaining a charge level signal from charge level detection circuitry, the obtained charge level signal representing an amount of charge remaining in a removable power supply coupled to a control unit of the control device;
determining, by the control unit based on the obtained charge level signal, a percentage amount of charge remaining in the removable power supply; and
in response to the determined percentage amount of charge remaining, illuminating a number of a plurality of indicator lights coupled to the control unit, wherein the number of the indicator lights illuminated indicates the determined percentage amount of charge remaining of the removable power supply.

* * * * *